(12) United States Patent
Schlosser et al.

(10) Patent No.: US 7,741,979 B2
(45) Date of Patent: Jun. 22, 2010

(54) HAPTIC KEYBOARD SYSTEMS AND METHODS

(75) Inventors: James William Schlosser, Spokane, WA (US); Cody George Peterson, Coeur d'Alene, ID (US); Andrew Huska, Post Falls, ID (US)

(73) Assignee: Pacinian Corporation, Spokane, WA (US)

( * ) Notice: Subject to any disclaimer, the term of this patent is extended or adjusted under 35 U.S.C. 154(b) by 0 days.

(21) Appl. No.: 11/945,879

(22) Filed: Nov. 27, 2007

(65) Prior Publication Data

US 2009/0007758 A1 Jan. 8, 2009

Related U.S. Application Data

(60) Provisional application No. 60/948,377, filed on Jul. 6, 2007.

(51) Int. Cl.
*H03K 17/94* (2006.01)

(52) U.S. Cl. ................................. 341/27; 84/615

(58) Field of Classification Search .............. 84/615, 84/653; 341/22–34; 345/156, 157
See application file for complete search history.

(56) References Cited

U.S. PATENT DOCUMENTS

| | | | |
|---|---|---|---|
| 5,239,152 A | | 8/1993 | Caldwell et al. |
| 6,218,966 B1 | | 4/2001 | Goodwin et al. |
| 7,166,795 B2 * | | 1/2007 | Lengeling ............ 84/737 |
| 7,182,691 B1 | | 2/2007 | Schena |
| 7,196,688 B2 * | | 3/2007 | Schena ............ 345/156 |
| 7,339,572 B2 * | | 3/2008 | Schena ............ 345/156 |
| 7,342,573 B2 * | | 3/2008 | Ryynanen ............ 345/173 |
| 2002/0054060 A1 | | 5/2002 | Schena |
| 2002/0149561 A1 * | | 10/2002 | Fukumoto et al. ........... 345/156 |
| 2003/0209131 A1 * | | 11/2003 | Asahi ............ 84/485 R |
| 2004/0252104 A1 | | 12/2004 | Nakamura et al. |
| 2005/0017947 A1 | | 1/2005 | Shahoian et al. |
| 2005/0157893 A1 * | | 7/2005 | Pelrine et al. ............ 381/190 |
| 2005/0204906 A1 * | | 9/2005 | Lengeling ............ 84/744 |
| 2005/0237309 A1 | | 10/2005 | Sharma |
| 2006/0256075 A1 | | 11/2006 | Anastas et al. |
| 2006/0261983 A1 | | 11/2006 | Griffin et al. |
| 2007/0091070 A1 | | 4/2007 | Larsen et al. |
| 2007/0146317 A1 | | 6/2007 | Schena |
| 2007/0152974 A1 | | 7/2007 | Kim et al. |
| 2007/0193436 A1 * | | 8/2007 | Chu ............ 84/609 |

(Continued)

FOREIGN PATENT DOCUMENTS

DE 19704253 8/1998

(Continued)

OTHER PUBLICATIONS

"Tactile Perception and Design", Retrieved from <http:///www.tireesias.org/reports/tpd2.htm>, 10 pages.

(Continued)

*Primary Examiner*—David S. Warren

(57) ABSTRACT

Various embodiments provide keyboards that utilize electrically-deformable material as an actuating mechanism to provide haptic feedback to a user of the keyboard. In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

24 Claims, 8 Drawing Sheets

U.S. PATENT DOCUMENTS

| | | | |
|---|---|---|---|
| 2007/0234887 A1* | 10/2007 | Sawada et al. | 84/723 |
| 2007/0234890 A1* | 10/2007 | Yamashita | 84/745 |
| 2007/0236449 A1 | 10/2007 | Lacroix | |
| 2008/0083314 A1* | 4/2008 | Hayashi et al. | 84/22 |
| 2008/0084384 A1 | 4/2008 | Gregorio et al. | |
| 2008/0092720 A1* | 4/2008 | Yamashita et al. | 84/600 |
| 2008/0289952 A1* | 11/2008 | Pelrine et al. | 204/165 |
| 2008/0303782 A1 | 12/2008 | Grant et al. | |
| 2009/0002205 A1* | 1/2009 | Klinghult et al. | 341/33 |
| 2009/0178913 A1 | 7/2009 | Peterson | |
| 2009/0189790 A1 | 7/2009 | Peterson | |
| 2009/0189873 A1 | 7/2009 | Peterson | |
| 2009/0210568 A1 | 8/2009 | Peterson et al. | |
| 2009/0231277 A1 | 9/2009 | Peterson | |

FOREIGN PATENT DOCUMENTS

| | | |
|---|---|---|
| DE | 10126670 | 12/2002 |
| DE | 2005002417 | 4/2005 |
| DE | 2004005501 | 8/2005 |
| EP | 0654727 | 5/1995 |
| EP | 1310860 | 5/2003 |
| EP | 1548776 | 6/2005 |
| WO | WO-0191100 | 11/2001 |
| WO | WO-2009043605 | 4/2009 |
| WO | WO-2009097358 | 8/2009 |
| WO | WO-2009097359 | 8/2009 |
| WO | WO-2009097361 | 8/2009 |
| WO | WO-2009114827 | 9/2009 |

OTHER PUBLICATIONS

"Haptics: Learning Through Touch", Retrieved from <http://ced.ncsu.edu/nanoscale/haptics.htm>, (2004),5 pages.
Bark, Karlin "Functional Prototype I", Retrieved from <http://bdml.stanford.edu/twiki/bin/view/Haptics/FunctionalPrototypeI?skin=print.pattern>, (Aug. 9, 2005),3 pages.
"Touch-Hapsys", Retrieved from <http://www.touch-hapsys.org>, 2 pages.
Pasquero, Jerome "Stimulation of the Fingertip by Lateral Skin Strech", Retrieved from <http://www.cim.mcgill.ca/~jay/index_files/research.htm>, 5 pages.
Wing, Alan et al., "Multidimensional Haptics Preliminary Report", Retrieved from <http://www.touch-hapsys.org>, (Sep. 21, 2003),pp. 1-125.
Wu, Xingtao et al., "A generalized Capacitance-Based Model for Electrostatic Micro-Actuators", Department of Physics, New Jersey Institute of Technology, Newark, NJ, 07102-1982 Department of Mechanical Engineering, Columbia University, NY 10027,pp. 1-23.
Jones, Gail et al., "A Comparison of Learning with Haptic and Visual Modalities", National Science Foundation REC- 0087389,pp. 1-20.
Kajimoto, Hiroyuki et al., "Electro-Tactile Display with Tactile Primary Color Approach", Graduate School of Information and Technology, The University of Tokyo,2 pages.
Gorinevsky, Dimitry "Adaptive membrane for large lightweight space telescopes", SPIE Astronomical Telescopes and Instrumentation,(2002),pp. 1-9.
Odell, D.L. et al., "MicroRobot Convveyance and Propulsion System Using Comb Drive and Parallel Plate Actuators: The ScuttleBot", UC Berkley,4 pages.
Zou, Jun et al., "Design of a Wide Tuning Range Micromachined Tunable Capacitor for Wireless Communications", Micro Actuators, Sensors, and Systems (MASS) Group Microelectronics Laboratory, University of Illinois, Urbana, IL 61801,6 pages.
Pasquero, Jerome "Stress: A Tactile Display Using Lateral Skin Stretch", Department of Electrical and Computer Engineering McGill University, Montreal,(Oct. 2003),75 pages.
Jones, Lynette "Human Factors and Haptic Interfaces", Department of Mechanical Engineering, Massachusetts Institute of Technology,40 pages.

Yang, Gi-Hun "Novel Haptic Mouse System for Holistic Haptic Display and Potential of Vibrotactile Stimulation", Human-Robot Interaction Reserach Center Korea Advanced Institute of Science and Technology,17 pages.
Hollis, Ralph "Haptics", *Bershire Encyclpedia of Human-Computer Interaction*, Berkshire Publishing Group,(2004),pp. 311-316.
"Proposed Experiment Protocol and Details", Retrieved from <http://bdml.stanford.edu/twiki/bin/view/Haptics/ProposedExperi0mentProtocolAndDetails>, 5 pages.
Mok Ha, Soon et al., "Interpenetrating Polymern Networks for High-Performance Electroelastomer Artificial Muscles", Department of Materials Science and Engineering, UCLA,pp. 1-19.
Beavers, Alex "Basic Concepts for Commercial Applications of Electroactive Polymer Artificial Muscle", Artificial Muscle Incorporated, Menlo Park, CA,10 pages.
Ashley, Steven "Artificial Muscles", *Scientific American*, Availallbe at <www.sciam.com>,(Oct. 2003),pp. 53-59.
Pasquero, Jerome "Tactile Display Survey", Technical Report TR-CIM 06.04,6 pages.
"Haptic Touch Technology", Pacinian,(Nov. 2007),2 pages.
Bar-Cohen, Yoseph "Electroactive Polymers", Retrieved from <http://electrochem.cwru.edu/ed/encycl/>, Electrochemistry Encyclopedia,(Dec. 2004),7 pages.
Fontaine, Ebraheem "A Laroratory Demonstration of a Parallel Robotic Mechanism", Massachusetts Institue of Technology,(Jun. 2002),pp. 1 -14.
"Elastomers: Powerful Polymer", Retrieved from <http://appliancedesign.com/copyright/>, (Jun. 2006),5 pages.
Bar-Cohen, Yoseph "Worldwide Electroactive Polymers", (*Artificial Muscles*) *Newsletter*, vol. 7, No. 2, Available at <http://eap.jpl.nasa.gov>,(Dec. 2005),pp. 1-16.
Bifano, Thomas "Parallel Plate Electrostatic Actuation for High-Resolution Deformable Mirrors", Boston University,(Aug. 19, 2004),35 pages.
Pasquero, Jerome "Survey on Communication Through Touch", *Technical Report: TR-CIM 06.04*, Center for Intelligent Machines Department of Electrical and Computer Engineering,(Jul. 2006),pp. 1-27.
"Touch and Haptics", *2004 IEEE/ RSJ International Conference on Intelligent Robots and Systems*, (Sep. 28, 2004),32 pages.
O'Halloran, A et al., "Materials and Technologies for Artificial Muscle: A Review for the Mechatronic Muscle Project", *Topics in Bio-Mechanical Engineering*, Chapter 7, Department of Electronic Engineering, National University of Ireland Galway,(2004),pp. 184-215.
Biggs, James "Some Useful Information for Tacttile Display Design", *IEEE Transactions on Man-Machine Systems*, vol. 11, No. 1,(1970),pp. 19-24.
Raisamo, Roope "Tactile User Interfaces", New Interaction Techniques,(Aug. 2, 2001),30 pages.
Bar-Cohen, Yoseph "Low Mass Muscle Actuators (LoMMAs)", Telerobotic Task Sponsered by NASA HQ, Code S,(Oct. 23, 1997),18 pages.
"Role of Skin Biomechanics in Mechanoreceptor", Retrieved from <http://touchlab.mit.edu/oldresearch/currentwork/humanhaptics/roleofskinbiomechanics/> on Dec. 20, 2007, MIT Touch Lab,(Dec. 20, 2007),pp. 1-13.
Spires, Shelby "Artificial Strongman", *Smart Business: For The New Economy*, (Nov. 2000),1 page.
Sommer-Larsen, Peter "Artificial Muscles", Rise National Laboratory, Condensed Matter Physics and Chemistry Department,3 pages.
Bar-Cohen, Yoseph "Electric Flex", *IEEE Spectrum Online*, (Jun. 2004),6 pages.
Bar-Cohen, Yoseph "Electroactive Polymers as Artificial Muscles-Capabilities, Potentials and Challenges", *Robotics 2000*, Available at <www.spaceandrobotics>,(Feb. 28-Mar. 2, 2000),pp. 1-8.
Carpi, Federico et al., "Dielectric Elastomers as Electromechanical Transducers: Fundamentals, Materials, Devices, Models and Applications of an Emerging Elecrotactive Polymer Technology", *Elsevier Ltd.*, (2008),12 pages.
Hayward, Vincent et al., "Tactile Display Device Using Distributed Lateral Skin Stretch", *Proceedings of the Haptic Interfaces for Virtual Environment and Teleoperator Systems Symposium*, ASME International Mechanical Engineering Congress & Exposition,(2000),pp. 1309-1314.

Seeger, Joseph et al., "Dynamics and Control of Parallel-Plate Actuators Beyond the Electrostatic Instability", *Transducers "99 The 10th Interrnational Conference on Solid State Sensors and Actuators*, (Jun. 1999),pp. 474-477.

"Nanoactuators Based on Electrostatic Forces on Dieletrics", Retrieved from <http://www.nasatech.com/Briefs/Apr05/NPO30747.html>on Nov. 28, 2005, NASA's Jet Propulsion Laboratory, Pasadena, CA,4 pages.

Bar-Cohen, Yoseph et al., "Enabling Novel Planetary and Terrestrial Mechanisms Using Electroactive Materials at the JPL's NDEAA Lab", Retrieved from http://ndeaa.jpl.nasa.gov>, pp. 1-6.

Pei, Qibing et al., "Multiple-Degrees-of-Freedom Electroelastomer Roll Actuators", *SRI International Institute of Physics Publishing*, (2004),pp. N86-N92.

"New SRI International sSpin-Off, Artificial Muscle, Inc., Secure Series a Funding from Leading VC Firms", Retrieved from <http://www.sri.com/news/releases/05-03-04.html> on Jan. 30, 2008, SRI International Spin Offs Artificial Muscle, Inc,(May 2004),2 pages.

Jager, Edwin et al., "Microfabricating Conjugated Polymer Actuators", *Science Magazine*, vol. 290, www.sciencemag.org,(Nov. 24, 2000),pp. 1540-1544.

Wingert, Andreas et al., "On the Kinematics of Parallel Mechanisms with Bio-stable Polymer Actuators", Department of Mechanical Engineering, Massachussetts Institute of Technology Cambridge,8 pages.

Bicchi, Antonio et al., "Haptic Illusions Induced by the Tactile Flow", Interdepartmental Research Centre "E. Piaggo", University of Pisa,16 pages.

Wagner, Christopher et al., "Integrating Tactile and Force Feedback with Finite Element Models", Division of Engineering and Applied Sciences, Harvard University,6 pages.

Bar-Cohen, Y. "Electroactive Polymer (EAP) Actuators as Artificial Muscles—Reality, Potential and Challenges", *SPIE Press*, (Mar. 18, 2004),pp. 26 and 548-550.

Van De Mortel, Dirk "Exploration of Smart Materials for the Use of User-System Interaction", *User System Interaction. Faculty Industrial Design*. TU/e, (Apr. 2002),pp. 21-24.

"PCT Search Report", Application Serial No. PCT/US2009/032288, (Apr. 29, 2009), 13 pages.

"PCT Search Report", Application Serial No. PCT/US2009/037191, (May 28, 2009), 11 pages.

"PCT Search Report", Application Serial No. PCT/US2009/032292, (Aug. 11, 2009), 17 pages.

"PCT Search Report", Application No. PCT/US2009/032289, (Dec. 23, 2009), 13 pages.

"PCT Search Report and Written Opinion", Application No. PCT/US2010/020380, (Apr. 12, 2010),13 pages.

* cited by examiner

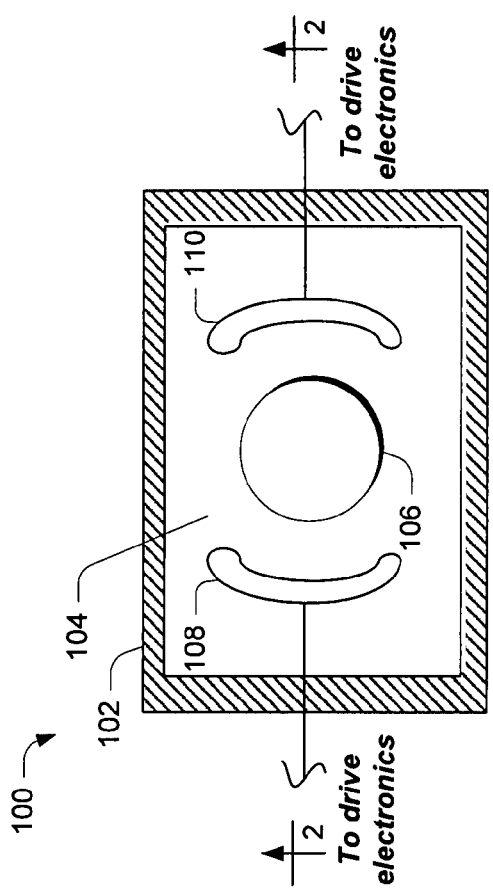
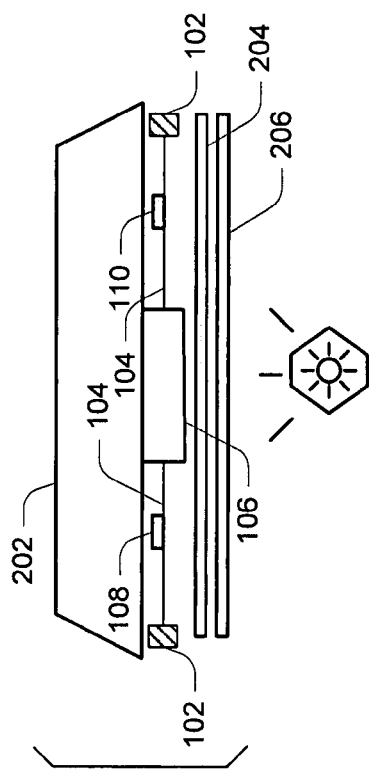

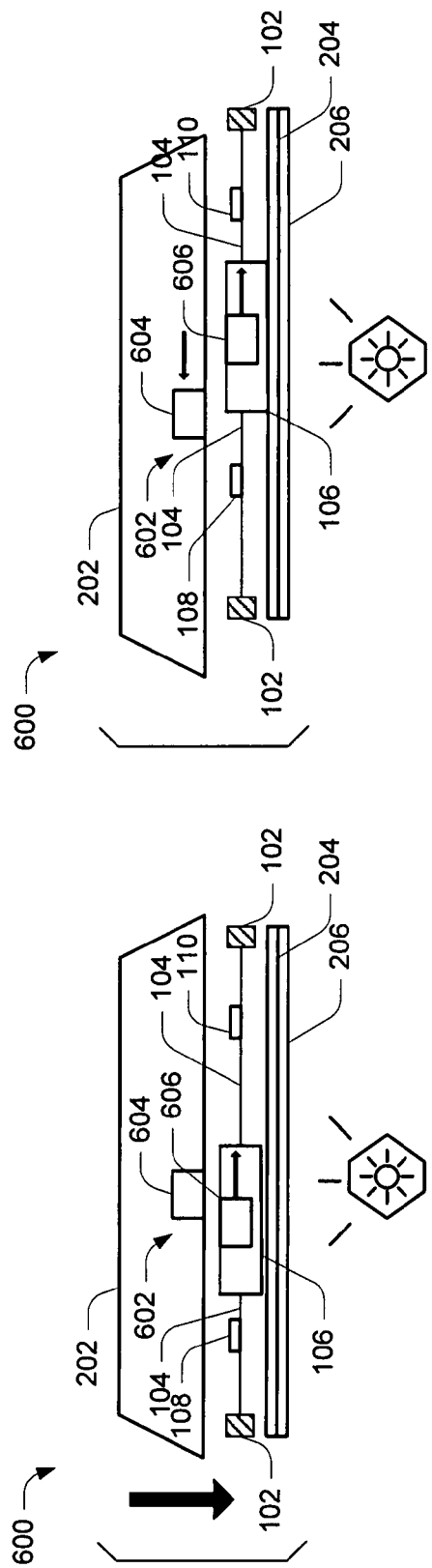
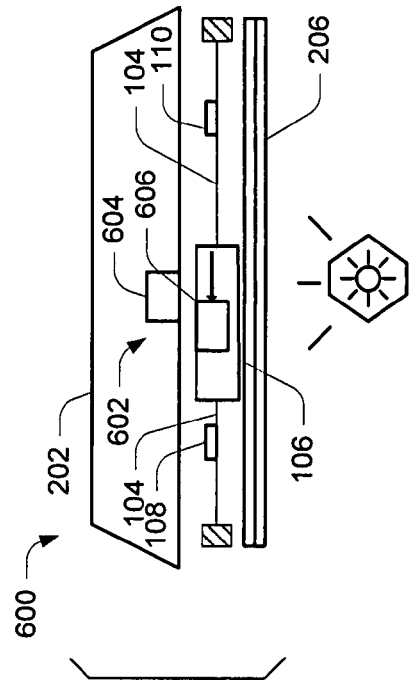
Fig. 6
Fig. 7
Fig. 8

HAPTIC KEYBOARD SYSTEMS AND METHODS

RELATED APPLICATION

This application claims priority to U.S. Provisional Application No. 60/948,377, filed on Jul. 6, 2007, the disclosure of which is incorporated by reference herein.

BACKGROUND

Today, rapid typing keyboard technologies typically embody three primary attributes that are viewed as necessary or desirable for an effective implementation—low actuation force, significant travel distance, and tactile "snapover".

With regard to a low actuation force, studies have found that in order for a user to rapidly type, it is desirable to provide an overall key top actuation force from around between 40-80 grams. Having a light actuation force permits easy actuation and reduces fatigue.

With regard to travel distance, in order to rapidly type, many current technologies provide an overall travel distance (i.e. the vertical distance a key travels) from between 2-4 millimeters. In technologies that implement keyboards using elastomeric domes that are collapsible under pressure for key actuation, the travel distance is required because of the physical and mechanical nature of the domes that are employed. Specifically, the physical structure of the dome requires a longer travel distance in order to allow the dome geometry to adequately collapse, thus providing a response with tactile characteristics that are necessary or desirable for rapid typing. In addition, this travel distance is important because as a key top moves relative to a finger, frictional forces of this relative movement provide an additional tactile element (i.e. localized skin stretching) that plays an important role in a user's recognition of an electronic switch closure. The travel distances required by current dome technology significantly limit the form factor, e.g. the thickness of an associated keyboard. That is, keyboard thickness is significantly limited by the use of dome technology. This, in turn, reduces keyboard construction potentials and the various environments in which such keyboards can be used.

With regard to the tactile snapover, such is an important aspect for rapid typing. A snapover, as will be appreciated by the skilled artisan, creates a specific tactile response which is desirable in typing scenarios, particularly those that are rapid typing scenarios. The notion of snapover refers to a relationship between force and travel and is defined as a specific area on a standard keyboard force displacement curve. Snapover is what users typically associate with a valid electronic switch closure. In addition, this association between the tactile response and an electronic switch closure allows the user to learn to not rely solely on visual confirmation during typing, such as looking at the screen between each typed letter, to ensure that they are typing correctly. In current rubber dome technologies, this snapover is achieved due to the collapsing of the rubber dome. Typically, force exerted on the key and hence, on the rubber dome increases until the dome collapses and achieves switch closure. Due to the geometry and the physical characteristics of the rubber dome, achieving a snapover effect requires a sufficient amount of force and travel to reach the snapover point.

Against the backdrop, a need remains for keyboards that provide adequate user feedback and address the three attributes mentioned above.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Various embodiments provide keyboards that utilize an electrically-deformable material as an actuating mechanism to provide haptic feedback to a user of the keyboard. In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

In at least some embodiments, the electrically-deformable material is driven with a voltage responsive to a user depressing a key or keyboard element. In these embodiments, switch closure is first attained followed by the haptic feedback provided through the multi-vectored movement of the key or keyboard element. In at least some embodiments, the multi-vectored movement moves the key or keyboard element in at least a first direction, and then a second direction which is different from the first. Each of the directional movements is induced by its own driven voltage which is applied to different areas of the electrically-deformable material. In at least some embodiments, one of the directions of movement moves the key or keyboard element a distance which is greater than another of the directions of movement.

In a specific embodiment, a first direction of movement is generally toward the user and a second direction of movement is generally away from the user. In at least some embodiments, the first direction moves the key or keyboard element a distance which is less than a distance that the second direction moves the key or keyboard element. In one embodiment, the first direction moves the key or keyboard element a distance which is about half the distance that the second direction moves the key or keyboard element.

In at least some embodiments, multiple keys or keyboard elements can be grouped together into a logical grouping which is driven in a multi-vectored movement to provide haptic feedback. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

In at least some embodiments, the electrically-deformable material comprises an electroactive polymer or EAP. Other electrically-deformable materials can, of course, be used.

BRIEF DESCRIPTION OF THE DRAWINGS

The same numbers are used throughout the drawings to reference like features.

FIG. 1 illustrates a top plan view of example key or keyboard element in accordance with one or more embodiments.

FIG. 2 illustrates the view of the FIG. 1 key or keyboard element, taken along line 2-2 in FIG. 1.

FIG. 6 illustrates a key or keyboard element in accordance with one or more embodiments.

FIG. 7 illustrates a key or keyboard element in accordance with one or more embodiments.

FIG. 8 illustrates a key or keyboard element in accordance with one or more embodiments.

DETAILED DESCRIPTION

Overview

Figure 3:
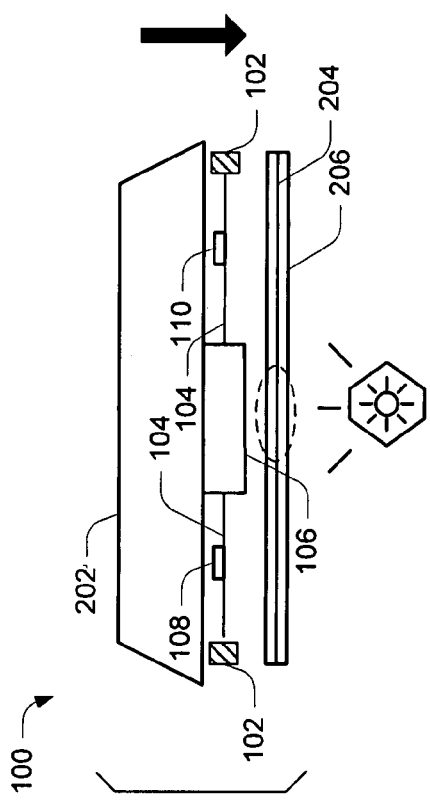
FIG. 3 illustrates a key or keyboard element in accordance with one or more embodiments.

Various embodiments provide keyboards that utilize an electrically-deformable material as an actuating mechanism to provide haptic feedback to a user of the keyboard. Haptic feedback refers to feedback that is provided through movement related to touch.

In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

In at least some embodiments, the electrically-deformable material is driven with a voltage responsive to a user depressing a key or keyboard element. In these embodiments, switch closure is first attained followed by the haptic feedback provided through the multi-vectored movement of the key or keyboard element. In at least some embodiments, the multi-vectored movement moves the key or keyboard element in at least a first direction, and then a second direction which is different from the first. Each of the directional movements is induced by its own driven voltage which is applied to different areas of the electrically-deformable material. In at least some embodiments, one of the directions of movement moves the key or keyboard element a distance which is greater than another of the directions of movement.

In a specific embodiment, a first direction of movement is generally toward the user and a second direction of movement is generally away from the user. In at least one embodiment, the first direction moves the key or keyboard element a distance which is less than a distance that the second direction moves the key or keyboard element. In one embodiment, the first direction moves the key or keyboard element a distance which is about half the distance that the second direction moves the key or keyboard element.

In at least some embodiments, multiple keys or keyboard elements can be grouped together into a logical grouping which is driven in a multi-vectored movement to provide haptic feedback. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

In at least some embodiments, the electrically-deformable material comprises an electroactive polymer or EAP. Other electrically-deformable materials can, of course, be used.

In the discussion that follows, a section entitled "Example Key or Keyboard Element" is provided and describes but one example of a key or keyboard element in accordance with one or more embodiments. Following this, a section entitled "Magnetically-Induced Snapover Effect" is provided and describes one example of how snapover effect can be achieved using a magnetic assembly. Following this, a section entitled "Drive Circuit" is provided and describes an example circuit that can be used as drive circuitry. Next, a section entitled "Detent Structure" is provided and describes an example detent structure that can be utilized to provide a snapover effect. A section entitled "Example System" is provided and describes a system that can be used in accordance with one or more embodiments. Next, a section entitled "Logical Key Groupings" is provided and describes how multiple different keys can be grouped together in accordance with one or more embodiments. Lastly, a section entitled "Example Method" is provided and describes a method in accordance with one or more embodiments.

Example Key or Keyboard Element

FIG. 1 illustrates an example key or keyboard element in accordance with one or more embodiments generally at 100. In this example, the key or keyboard element includes a frame 102 to which is mounted or otherwise connected to one or more sections of electrically-deformable material 104. Frame 102 is supported by an overall housing an example of which is provided below in FIG. 11. In the illustrative example, electrically-deformable material 104 comprises a single integral piece of material. It is to be appreciated and understood, however, that individual keys or keyboard elements can have multiple different sections of electrically-deformable material.

In at least some embodiments, the electrically-deformable material comprises an electro-active polymer or EAP. EAP refers to a class of polymers which are formulated to exhibit different physical, electrical, and/or electro-optical behaviors and properties. In general, when EAP is driven by an applied voltage, the EAP undergoes a deformation in a particular direction. This deformation causes the EAP to move in the particular direction. In this particular embodiment, the electrically-deformable material 104 is driven by one or more drive voltages to effect movement of an associated key or keyboard element. To this end, and in this embodiment, key or keyboard element 100 includes a center actuator 106 which is mounted to or otherwise joined with electrically-deformable material 104. Actuator 106, in turn, is fixedly connected to an associated key or keyboard element (not shown) which lies above the plane of the page upon which FIG. 1 appears.

Key or keyboard element 100 also includes one or more electrical contacts which are used to apply a drive voltage to electrically-deformable material 104. In the illustrated and described embodiment, first and second electrical contacts 108, 110 are provided and are in electrical communication with the electrically-deformable material 104. In turn, the first and second electrical contacts 108, 110 are connected with drive electronics which are used to apply a voltage to the contact and hence, cause deformation of the electrically-deformable material 104. Any suitable material can be used for contacts 108, 110. In the illustrated and described embodiment, the electrical contacts comprise a carbon material which is mounted to or otherwise joined with the electrically-deformable material.

FIG. 2 illustrates key or keyboard element 100 of FIG. 1 in a view that is taken along line 2-2 in FIG. 1. Like numerals from the FIG. 1 illustration have been utilized to depict like components. Here, the key or keyboard element 100 includes a user-engageable portion 202 which is the portion that is typically depressed by the user. The user-engageable portion may, for example, correspond to a particular key, such as the letter "A" key, a function key, a shift key, and the like. The user-engagable portion includes a surface—here a top surface—that is typically engaged by a user's finger.

In addition, key or keyboard element 100 includes a pair of switch closure elements 204, 206 forming a switch. The switch closure elements can be formed from any suitable material examples of which include non-tactile membranes that include electrically conductive materials. Other materials include, by way of example and not limitation, conductive elastomeric material, carbon material, piezo-membrane, capacitive sensing, capacitive sensing in combination with piezo sensing and piezo ink, to name just a few. In addition, the switch closure elements can be located at any suitable location within the keyboard element. For example, the switch closure elements can be located between portion 202 and underlying structure, on top of portion 202, or any other suitable location. The switch closure elements are connected to circuitry to detect switch closure.

In addition, in at least some embodiments, backlighting can be provided by virtue of one or more light sources mounted underneath the key or keyboard element. The light sources can be implemented using any suitable technology. By way of example and not limitation, light sources can be implemented using LEDs, light pipes using LEDs, fiber optic mats, and/or electroluminescent panels to name just a few.

In at least some embodiments, the electrically-deformable material is generally translucent, thus allowing light to pass through and illuminate the undersides of the keys. This can allow, for example, key legends to be illuminated for the user. In the past, backlighting keyboards has proven difficult due to the presence of various actuation structures such as domes and scissor mechanisms which tend to block light.

Referring to FIG. 3, when a user depresses key or keyboard element 100 in the direction shown, switch closure elements 204, 206 are brought into electrical communication (as indicated by the dashed oval) which closes a circuit thus indicating that a key or keyboard element has been depressed. Circuitry described below detects the depression event and causes drive electronics to apply one or more drive voltages (e.g., 500-5000) volts to the electrically-deformable material 104. The drive electronics can be configured in any suitable way. For example, in some embodiments, the drive circuitry can include switching circuitry that switches a low voltage side of a power supply on or off using, for example, one power supply per key or keyboard element. Inductive transformers or piezoelectric transformers can be used to generate sufficient voltage supplies, as will be appreciated by the skilled artisan. Alternately or additionally, various solid state devices can be used to switch power from a single voltage supply to individual EAP portions as required. One specific example of a circuit suitable for use is shown and described below in a section entitled "Drive Circuit". Alternately or additionally, switching can be achieved using an application specific integrated circuit (ASIC) that contains a series array of solid state switch elements.

When the drive voltages are applied to the electrically-deformable material, multi-vectored movement is imparted to actuator 106 and hence, to portion 202.

Figure 5:
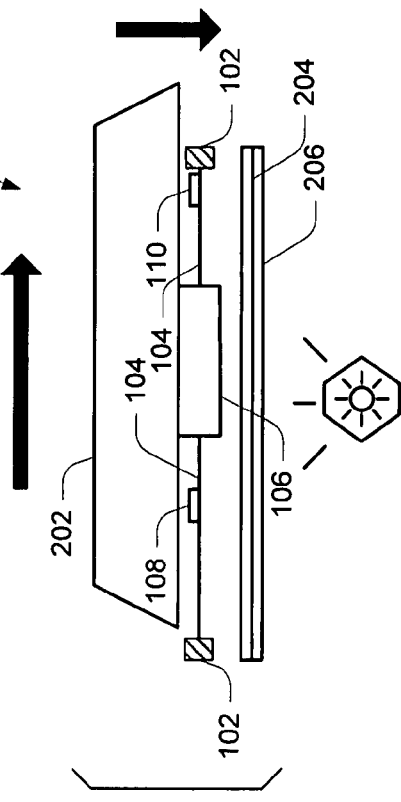
FIG. 5 illustrates a key or keyboard element in accordance with one or more embodiments.
Figure 4:
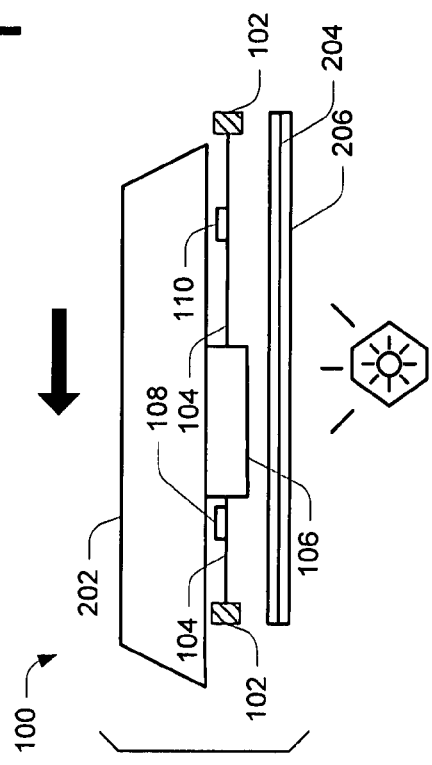
FIG. 4 illustrates a key or keyboard element in accordance with one or more embodiments.

Specifically, and as perhaps best shown in FIGS. 4 and 5, when a user depresses a key or a keyboard element sufficient to effect switch closure, the drive electronics drive the electrically-deformable material and hence, the key or keyboard element in a first direction which, in this example, is generally toward the user. In this example, the drive voltage is applied through electrical contact 110. Subsequently, the drive electronics, through electrical contact 108, drive the electrically-deformable material in a second, different direction. In this example, the second, different direction is generally away from the user. In at least some embodiments, the first direction moves actuator 106 a first distance and a second direction moves actuator 106 a second distance which is greater than the first distance. In at least some embodiments, the first distance is about half the distance of the second distance. In at least some embodiments, the first distance is about ½ millimeter and a second distance is about 1 mm.

The electrically-deformable material can, however, be operated in a "single phase" mode or a "dual phase" mode. In a single phase mode, when the material is electrically driven, the material moves the key or keyboard element in a desired direction. When the drive voltage is removed, the material returns to its original, starting position due to the resiliency of the material. In a dual phase mode, the material is driven as described above. Of course, multiple other phases can be used by driving the material to impart to it movements other than the "back and forth" movement described above.

Magnetically-Induced Snapover Effect

In at least some embodiments, movement of the key or keyboard element to provide a snapover effect is provided through a combination of the electrically-deformable material and a magnetic assembly comprising, in this example, a pair of opposed magnets that are mounted in the key or keyboard element structure.

As an example, consider FIG. 6. There, a key or keyboard element is shown generally at 600. Like numerals from the above-described embodiments are utilized to depict like components. Here, a magnet assembly 602 includes a first magnet 604 and a second magnet 606. First magnet 604 is seated or otherwise fixedly mounted to user-engageable portion 202. Second magnet 606 is mounted to electrically-deformable material 104. When a user depresses a key or keyboard element, a drive voltage is applied to the electrically-deformable material 104 sufficient to cause second magnet 606 to move in the direction indicated. In this example, the drive voltage is applied first by electrical contact 108. As the second magnet 606 moves in the indicated direction, the interaction of the magnetic fields of magnets 604, 606 causes magnet 604 to be driven in an opposite direction as indicated in FIG. 7. As first magnet 604 is driven under the influence of the magnets' magnetic fields, user engageable portion 202 is moved in a first direction, as shown in FIG. 7. A second drive voltage is then applied by electrical contact 110 to cause second magnet 606 to be moved in the opposite direction as shown in FIG. 8. Again, this causes the magnetic fields of the magnet assembly to interact with one another and move the key or keyboard element back to what can be considered a starting location or equilibrium point.

Drive Circuit

Figure 8A:
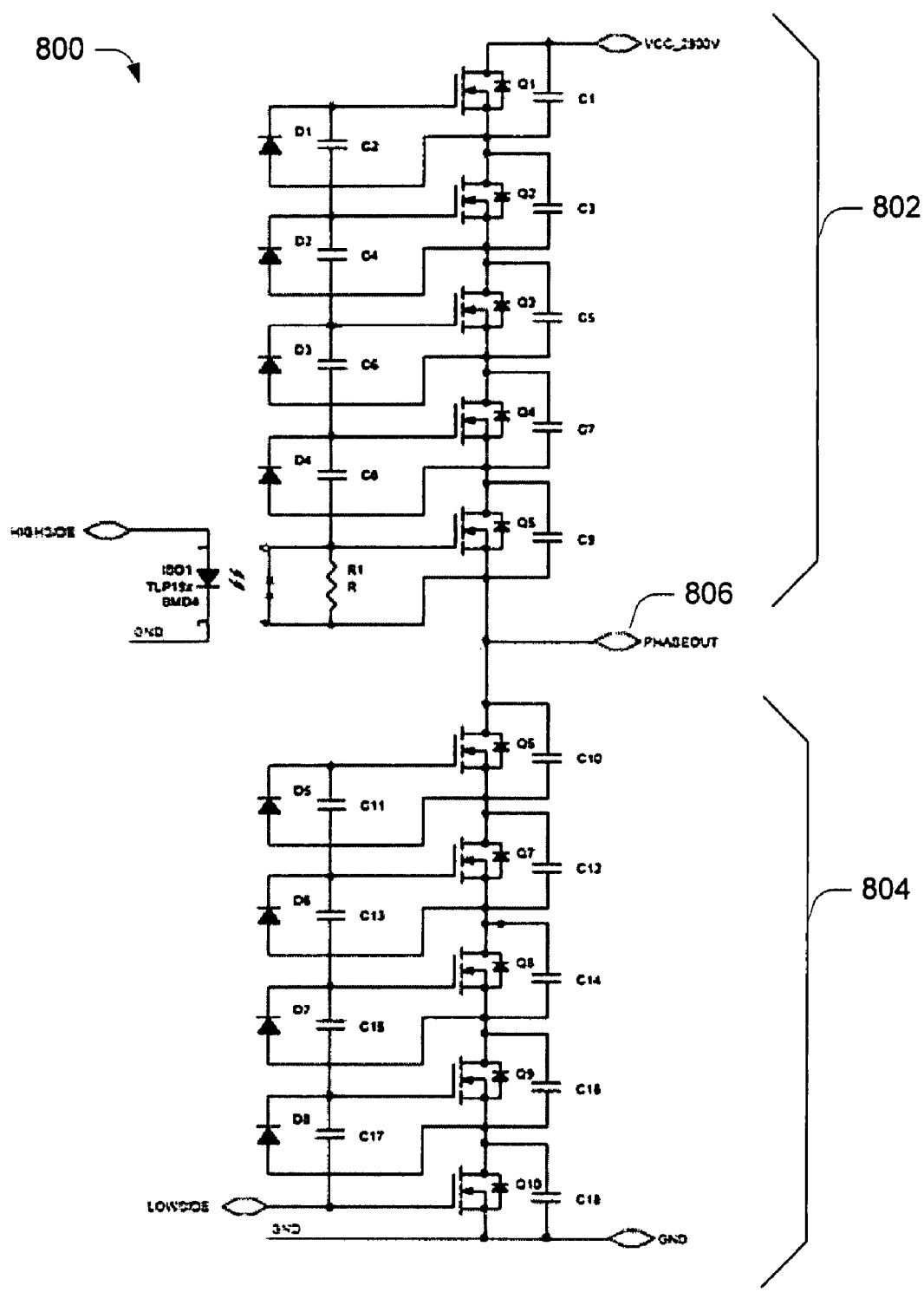
FIG. 8a is a circuit diagram in accordance with one or more embodiments.

FIG. 8*a* illustrates an example drive circuit in accordance with one embodiment, generally at 800. Here, there is a high side stack 802 and a low side stack 804. A supply voltage is connected across the stacks to ground. A phaseout node 806 is provided between the high side stack 802 and the low side stack 804.

Individual stacks are defined by collections of series-connected field effect transistors (FETs) individual ones of which are connected in parallel with a capacitive element or capacitor as shown. The parallel-connected capacitors reduce static power consumption. During a switching transient, the parallel capacitors equally share the voltage drop across the stack so that the sharing is even at the end of the dynamic mode.

Since there is no static current draw, there is no charge depletion to offset the balance. Of course there is always leakage in the capacitors and capacitive actuator that would be considered static current draw, but the FETs themselves have enough drain-source leakage that the leakage of the capacitors and load are offset and the system remains stable with a fast response. The leakage of the FETs is enough to maintain the static voltage sharing but since it is on the order of nanoamps there is an acceptable level of power dissipation, even for many stacks of devices in parallel.

As a design consideration, when driving capacitive loads, the dynamic load balancing is affected by the load charging time constant, causing the FET nearest the output to carry too little voltage which can make the other FETS fail due to exceeding their drain-source voltage rating when operating at high voltages close to the maximum rating of the stack. This happens as the stack turns on because the charge of capacitive load is lagging and therefore drawing as much charge from the neighboring nodes as possible. This charge depletion offsets the balance across the FETs since the resistance of the switching devices limits the current flow to the output. However, adding a capacitor across the nearest FET to the output (on the order of 1:50 actuator to added capacitor) solves the problem for these devices and switch speed since the capacitors will not let voltages change as quickly. When combining this corrective factor and the already existing parallel capacitors, all the capacitors in parallel with the FETs are the same value in order to keep the voltage sharing equal across the devices.

Detent Structure

Figure 9:
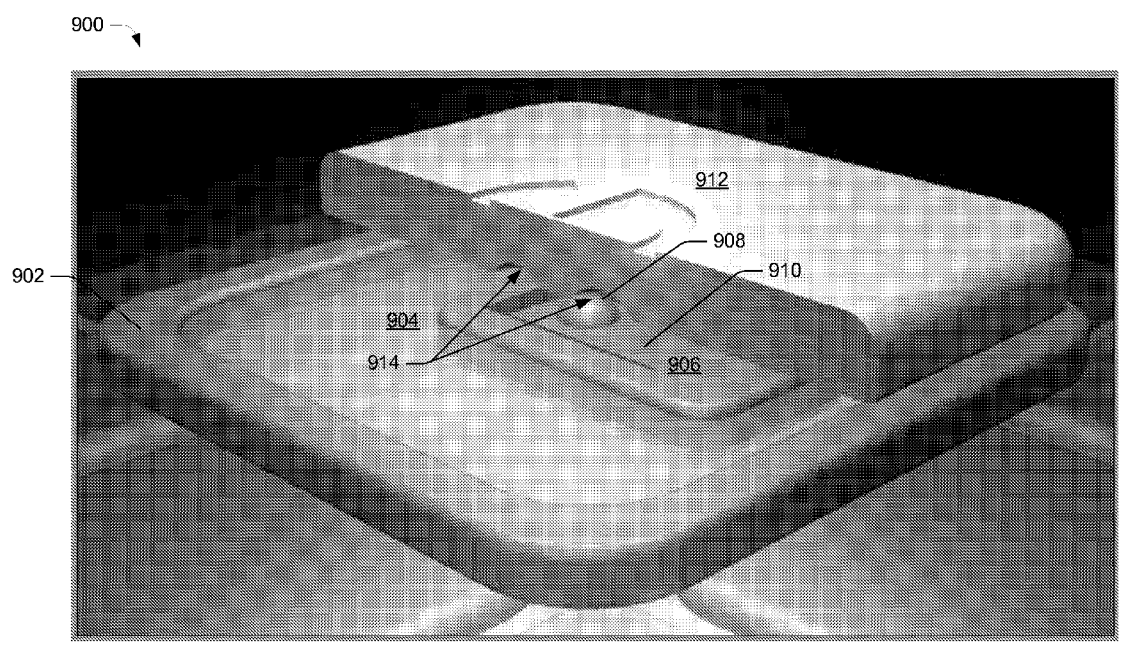
FIG. 9 illustrates a key or keyboard element in accordance with one or more embodiments.

In at least some embodiments, a detent structure can be utilized to impart a snapover effect when the user depresses a key or keyboard element. Any suitable detent structure can be utilized. As an example, consider FIG. 9.

There, a key or keyboard element is shown generally at 900. A frame 902 supports electrically-deformable material 904. A detent structure 906 includes a knob 908 which is supported by a flange 910 which acts as a spring. User-engageable portion 912 includes a pair of concave indentations 914. In this example, when the electrically-deformable material is driven by a voltage, it moves detent structure 906 causing knob 908 to ride into and out of the concave indentations 914 underneath the user engageable portion 912. As engagement and disengagement occurs between knob 908 and the concave indentations 914, a change in velocity takes place which is translated to the top surface of user engageable portion 912. This, in turn, provides haptic tactile feedback to a user's finger.

Example System

Figure 10:
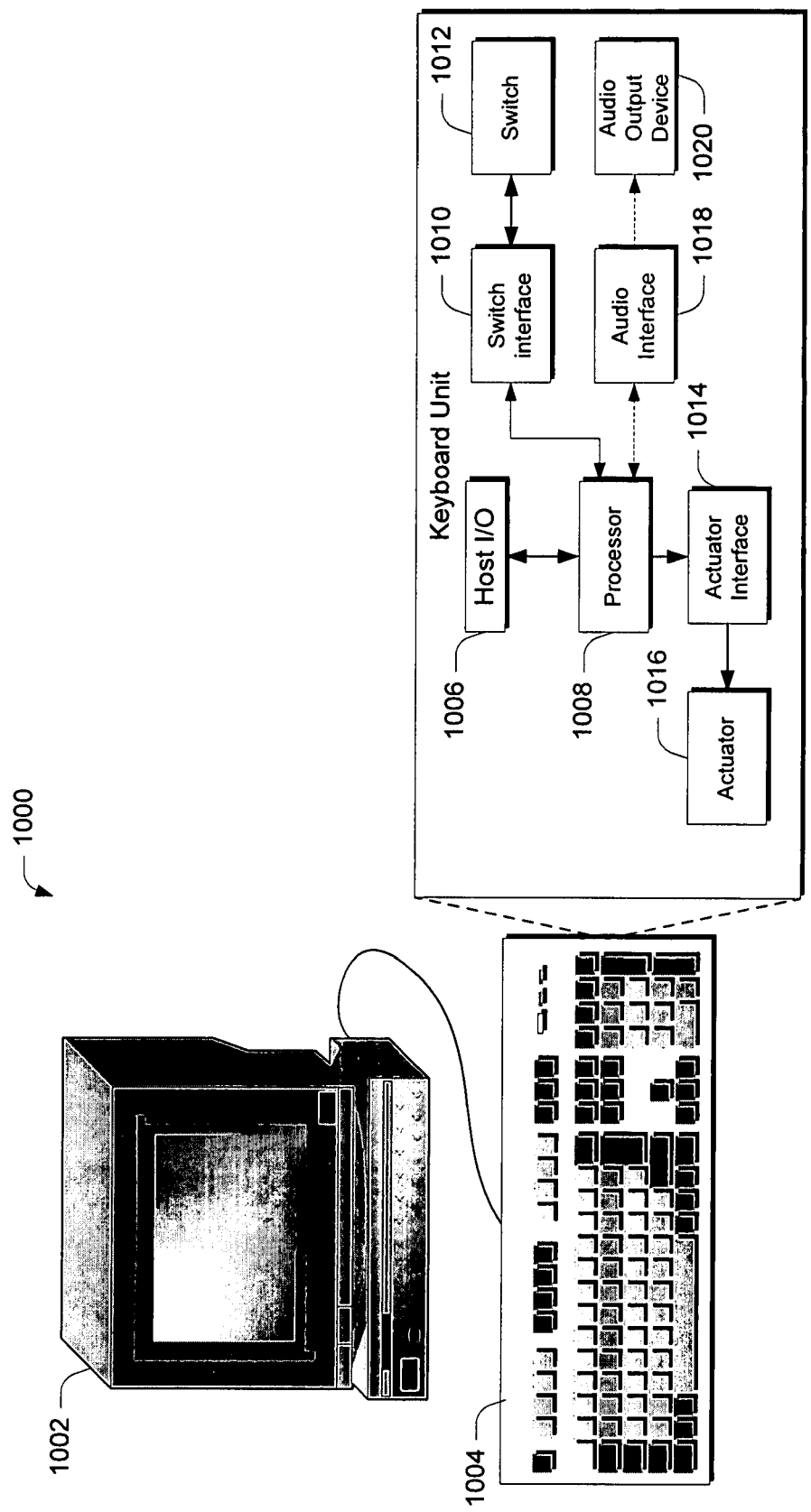
FIG. 10 illustrates a system in accordance with one or more embodiments.

FIG. 10 illustrates an example system in accordance with one embodiment generally at 1000. System 1000 includes, in this example, a computing device 1002 and a keyboard unit 1004. Computing device 1002 can include any suitable computing device such as a desktop computing device, laptop computer, notebook computer and the like.

Keyboard unit 1004 includes, in this example, a host input/output module 1006 which enables communication between computing device 1002 and keyboard unit 1004. Any suitable module can be used examples of which include, by way of example and not limitation, Universal Serial Bus (USB) modules, Bluetooth modules, RS232, PS2, CAN, TCPIP, and the like. Keyboard unit 1004 further includes a microprocessor 1008, a switch interface 1010, a switch 1012, an actuator interface 1014, an actuator 1016, and, optionally, an audio interface 1018 and an audio output device 1020. These various components can be implemented in connection with any suitable hardware, software, firmware or combination thereof. In at least some embodiments, components of the keyboard unit can be implemented as an application specific integrated circuit or ASIC.

In operation, switch 1012 is configured to sense when a particular key or keyboard element is depressed. One example of such a switch is switch closure elements 204, 206 in FIG. 2. Of course, other switch arrangements can be utilized without departing from the spirit and scope of the claimed subject matter, examples of which are provided above. Switch interface 1010 notifies microprocessor 1008 when a depression event has occurred. Microprocessor 1008 controls actuator interface 1014, which can include the above-mentioned drive electronics, effective to cause the drive electronics to apply a drive voltage(s) to actuator 1016. Actuator interface 1014 can be implemented in connection with any suitable hardware, software, firmware, or combination thereof. In this example, actuator 1016 includes both the electrically-deformable material, as well as the physical structure that is mounted to a key or keyboard element.

As noted above, the drive electronics can be used to drive the electrically-deformable material in any suitable way to achieve any suitable movement. In at least some embodiments, the drive electronics are utilized to drive the electrically-deformable material in a manner that imparts multi-vectored movement to the material and hence, to the key or keyboard element with which it is associated. In a specific implementation, this multi-vectored movement comprises a first movement in a first direction, and then a second movement in a second different direction. Of course, other movements and various other directions can be used without departing from the spirit and scope of the claimed subject matter.

Optionally, keyboard unit 1004 can include an audio interface 1018 and an associated audio output device 1020. In at least some embodiments, audio interface 1018 is in communication with microprocessor 1008 and can be configured to produce sounds associated with key or keyboard element depression events. For example, in at least some embodiments, sound recordings of key depressions can be saved and used by the audio interface 1018 to produce, via audio output device 1020, a key depression sound when the key is depressed by the user.

Logical Key Groupings

In at least some embodiments, multiple keys or keyboard elements can be grouped together into a logical grouping which is driven in a multi-vectored manner to provide haptic feedback to a user. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

Figure 11:
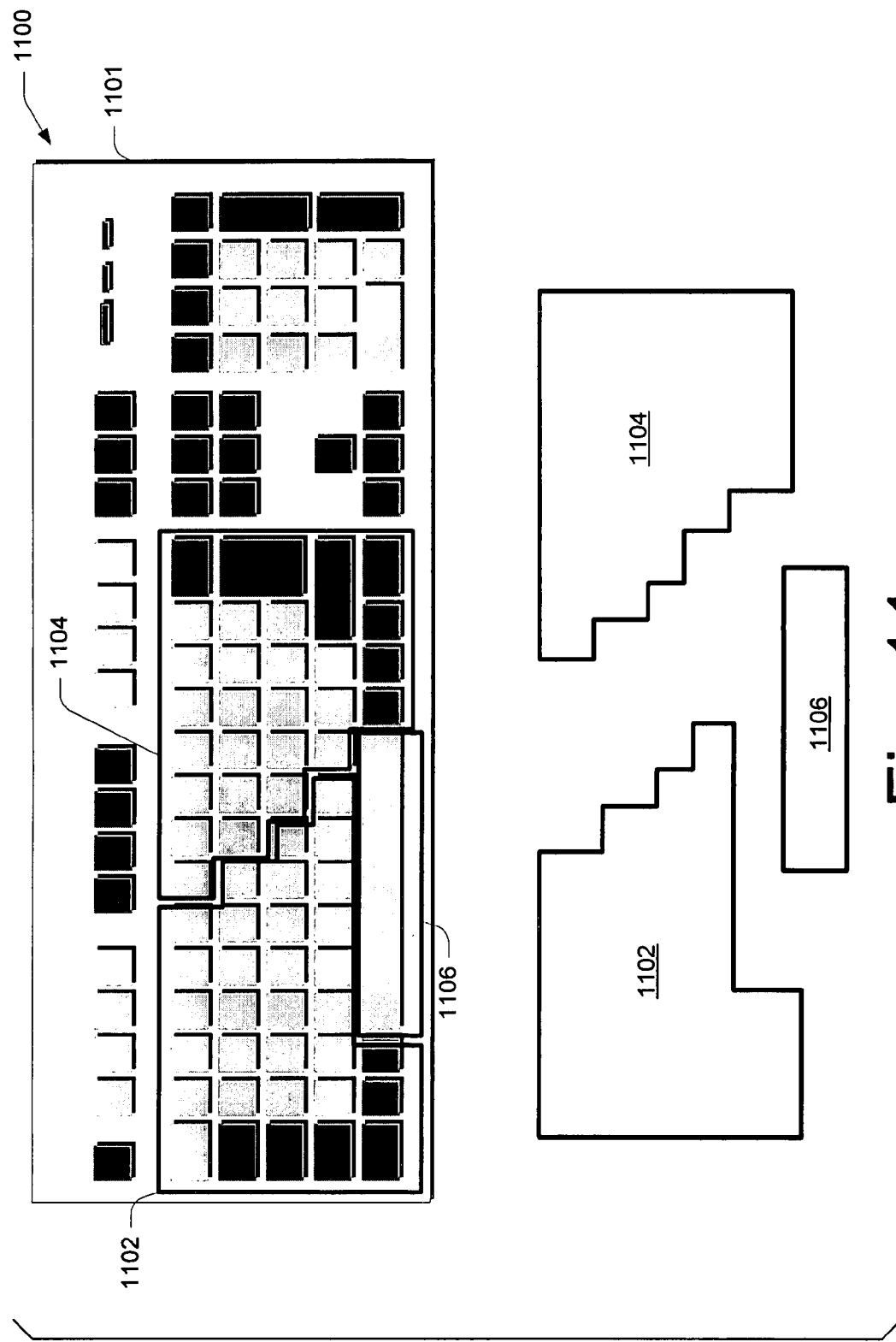
FIG. 11 illustrates an example keyboard in accordance with one or more embodiments.

As an example, consider FIG. 11. There, an example keyboard, in accordance with one or more embodiments, is shown generally at 1100. In this example, a keyboard housing 1101 contains or otherwise supports a plurality of keys. Some of the individual keys are grouped into two logical groupings 1102, 1104. These logical groupings define plates that are each moved in a multi-vectored manner as described above. In addition, a plate 1106 includes the space bar key and is separately driven by its own actuator. For clarity, the individual logical groupings are represented both superimposed on the illustrated keyboard and separately underneath the keyboard. It is to be appreciated and understood that in at least some embodiments, when individual keys or key groupings are moved, the overall housing that supports the keys is not moved. Effectively then, the systems described above can, in at least some embodiments, provide for discrete individual movement of keys or key groupings without moving the corresponding housing.

It is to be appreciated and understood that any suitable grouping of keys or keyboard elements can be used. In this particular example, the logical grouping of keys corresponds to those keys that are typically used by the right hand, and those keys that are typically used by the left hand. Of course, other logical key groupings can be used without departing from the spirit and scope of the claimed subject matter.

Example Method

Figure 12:
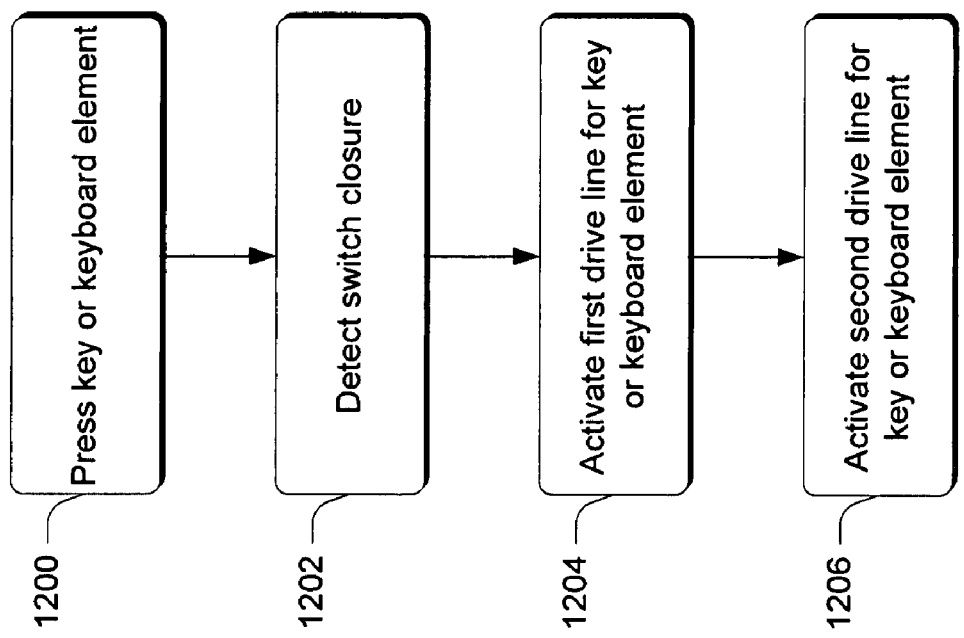
FIG. 12 is a flow diagram that describes steps in a method in accordance with one or more embodiments.

FIG. 12 is a flow diagram that describes steps a method in accordance with one embodiment. The method can be implemented in connection with any suitable hardware, software, firmware or combination thereof. In at least some embodiments, the method can be implemented by a system, such as those systems shown and described above. It is to be appreciated and understood that the described method can be implemented by systems other than those described above without departing from the spirit and scope of the claimed subject matter.

Step 1200 presses a key or keyboard element. This step is typically performed by a user. Step 1202 detects an associated switch closure. In the illustrated and described embodiments, a switch associated with a depressed key is utilized to ascertain when the key has been depressed. One specific example of how this can be done is provided above. Of course, other ways of sensing or detecting a switch closure can be used without departing from the spirit and scope of the claimed subject matter.

Responsive to detecting a switch closure at 1202, step 1204 activates a first drive line for the associated key or key board element. In one or more embodiments, the drive line is connected to an electrically-deformable material as described above. Activating the first drive line causes the electrically-deformable material to deform and hence, move the associated key in a first direction. Step 1206 activates a second drive line for the associated key or keyboard element. Again, this drive line is connected to the electrically-deformable material as described above. Activating the second drive line causes the electrically-deformable material to deform and hence, move the associated key in a second different direction. In the example above, the first and second directions are generally opposite of one another. In addition, the direction of movement is generally orthogonal to the direction of force applied by the user to depress the key. In this manner, the electrically-deformable material can be electrically driven to impart a multi-vectored movement to the key or keyboard element. As pointed out above, however, other directions of movements can be used without departing from the spirit and scope of the claimed subject matter. For example, a particular key may be driven in three or more directions to impart a desired haptic response.

Various embodiments can enable keyboards to provide a desired haptic response, yet be designed to embody a smaller form factor than those typically designed using rubber dome technology. In accordance with one or more embodiments, form factors of the switch, EAP and keytop can be designed as follows. It is to be appreciated and understood that the described form factors constitutes examples of one embodiment. As such, other form factors can be used without departing from the spirit and scope of the claimed subject matter. The described form factors refer to the vertical thickness of the identified elements, for example, as viewed in FIG. 2.

|  | Upper (about) | Range (between about) | Implementation (about) |
| --- | --- | --- | --- |
| Switch | .50 mm | .0508 mm-.50 mm | .2286 mm |
| EAP | 2.00 mm | .0175 mm-2.00 mm | 1.00 mm |
| Keytop | 1.50 mm | .254 mm-1.50 mm | .508 mm |
| Totals | 4.00 mm | .3223 mm-4.00 mm | 1.7366 mm |

CONCLUSION

Various embodiments provide keyboards that utilize an electrically-deformable material as an actuating mechanism to provide haptic feedback to a user of the keyboard. In at least some embodiments, the electrically-deformable material is utilized to impart, to a depressed key or keyboard element, a multi-vectored movement that produces a perceived acceleration of the key or keyboard element thus providing a user with haptic feedback which simulates a snapover movement.

In at least some embodiments, the electrically-deformable material is driven with a voltage responsive to a user depressing a key or keyboard element. In these embodiments, switch closure is first attained followed by the haptic feedback provided through the multi-vectored movement of the key or keyboard element. In at least some embodiments, the multi-vectored movement moves the key or keyboard element in at least a first direction, and then a second direction which is different from the first. Each of the directional movements is induced by its own driven voltage which is applied to different areas of the electrically-deformable material. In at least some embodiments, one of the directions of movement moves the key or keyboard element a distance which is greater than another of the directions of movement.

In a specific embodiment, a first direction of movement is generally toward the user and a second direction of movement is generally away from the user. In at least some embodiments, the first direction moves the key or keyboard element a distance which is less than a distance that the second direction moves the key or keyboard element. In one embodiment, the first direction moves the key or keyboard element a distance which is about half the distance that the second direction moves the key or keyboard element.

In at least some embodiments, multiple keys or keyboard elements can be grouped together into a logical grouping which is driven in a multi-vectored movement to provide haptic feedback. In this instance, each logical grouping constitutes a plate which is moved under the influence of the electrically-deformable material. In at least some embodiments, a keyboard can have single keys or keyboard elements that are driven under the influence of the electrically-deformable material, as well as logical groupings of keys or keyboard elements that are driven under the influence of the electrically-deformable material.

In at least some embodiments, the electrically-deformable material comprises an electroactive polymer or EAP. Other electrically-deformable materials can, of course, be used.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
   detecting a switch closure associated with a user touching a key or keyboard element on a keyboard having a plurality of keys or keyboard elements;
   responsive to said switch closure, applying one or more drive voltages to an electrically-deformable material connected to the key or keyboard element sufficient to provide multi-vectored movement to the key or keyboard element, wherein said movement, being generally orthogonal to a direction effective to cause switch closure, moves the key or keyboard element in a first direction and at least a second different direction, wherein one of the first or second directions moves the key or keyboard element a distance that is greater than a distance the other of the first or second directions moves the key or keyboard element.

2. The method of claim 1, wherein each direction of movement is caused by a different drive voltage.

3. The method of claim 2, wherein at least some individual drive voltages are applied to different areas of the electrically-deformable material.

4. The method of claim 1, wherein the second direction is generally opposite of the first direction.

5. The method of claim 1, wherein the first direction is generally toward the user.

6. The method of claim 5, wherein the second direction is generally away from the user.

7. The method of claim 5, wherein the first direction moves the key or keyboard element a distance that is less than a distance the second direction moves the key or keyboard element.

8. The method of claim 5, wherein the first direction moves the key or keyboard element a distance that is about half the distance that the second direction moves the key or keyboard element.

9. The method of claim 1, wherein at least some of keys of the keyboard are grouped into a logical grouping, and wherein the multi-vectored movement is applied to the logical grouping of keys.

10. The method of claim 1, wherein the electrically deformable material comprises an electroactive polymer (EAP).

11. The method of claim 1, wherein said multi-vector movement is achieved, at least in part, through the use of a magnetic assembly at least a portion of which is connected to the key or keyboard element.

12. A system comprising:
    a keyboard having a plurality of keys or keyboard elements;
    a frame associated with one or more keys or keyboard elements;
    an electrically-deformable material connected to the frame;
    an actuator connected between the electrically-deformable material and one or more keys or keyboard elements;
    one or more electrical contacts associated with the electrically-deformable material; and
    drive electronics associated with the one or more electrical contacts and configured to, upon depression of the key or keyboard element, apply a single or plurality of drive voltages to the electrically-deformable material sufficient to provide multi-vectored movement to the key or keyboard element, wherein said movements being generally orthogonal to a direction of the depression of the key or keyboard element, moves the key or keyboard element in a first direction and at least a second different direction, wherein one of the first or second directions moves the key or keyboard element a distance that is greater than a distance the other of the first or second directions moves the key or keyboard element.

13. The system of claim 12, wherein each direction of movement is caused by a different drive voltage.

14. The system of claim 13, wherein at least some individual drive voltages are applied to different areas of the electrically-deformable material.

15. The system of claim 12, wherein the electrically-deformable material comprises an electroactive polymer (EAP).

16. The system of claim 12 further comprising one or more light sources associated with the keyboard and configured to backlight keys or keyboard elements.

17. The system of claim 12, wherein the second direction is generally opposite of the first direction.

18. A keyboard comprising:
    multiple keys supported by a housing;
    a switch associated with one or more of the multiple keys;
    an electroactive polymer actuator operably coupled with the switch and said one or more of the multiple keys, wherein the electroactive polymer is configured, in an event of a switch closure, to be driven by one or more drive voltages effective to move said one or more of the multiple keys in a first direction and at least a second different direction generally orthogonal to a direction effective to cause switch closure, wherein one of the first or second directions moves the one or more of the multiple keys a distance that is greater than a distance the other of the first or second directions moves the one or more of the multiple keys.

19. The keyboard of claim 18, wherein movement of a key does not move the housing.

20. The keyboard of claim 18, wherein the electroactive polymer actuator is configured to move at least some of the keys in multiple different directions.

21. The keyboard of claim 18, wherein a key, switch and electroactive polymer actuator form an assembly having a form factor height no greater than about 4.0 mm.

22. The keyboard of claim 18, wherein a key, switch and electroactive polymer actuator form an assembly having a form factor height between about 0.3223 mm to 4 mm.

23. The keyboard of claim 18, wherein a key, switch and electroactive polymer actuator form an assembly having a form factor height of about 1.7366 mm.

24. The keyboard of claim 18, wherein the second direction is generally opposite of the first direction.

* * * * *